US012803511B2

(12) United States Patent
Stroet

(10) Patent No.: US 12,803,511 B2
(45) Date of Patent: Nov. 17, 2026

(54) LOGARITHMIC CURRENT TO VOLTAGE CONVERTERS WITH EMITTER RESISTANCE COMPENSATION

(71) Applicant: Analog Devices, Inc., Wilmington, MA (US)

(72) Inventor: Petrus M. Stroet, Santa Cruz, CA (US)

(73) Assignee: ANALOG DEVICES, INC., Wilmington, MA (US)

( * ) Notice: Subject to any disclaimer, the term of this patent is extended or adjusted under 35 U.S.C. 154(b) by 452 days.

(21) Appl. No.: 18/410,182

(22) Filed: Jan. 11, 2024

(65) Prior Publication Data

US 2024/0250647 A1 Jul. 25, 2024

Related U.S. Application Data

(60) Provisional application No. 63/481,266, filed on Jan. 24, 2023.

(51) Int. Cl.
*H03F 3/343* (2006.01)
*H03F 1/30* (2006.01)
*H03F 3/45* (2006.01)

(52) U.S. Cl.
CPC ........... *H03F 3/3432* (2013.01); *H03F 1/302* (2013.01); *H03F 3/45085* (2013.01); *H03F 3/456* (2013.01)

(58) Field of Classification Search
CPC .... H03F 3/3432; H03F 1/302; H03F 3/45085; H03F 3/456

(Continued)

(56) References Cited

U.S. PATENT DOCUMENTS 3,805,092 A * 4/1974 Henson .................... G06G 7/24 327/356
3,845,326 A 10/1974 Godden (Continued)

FOREIGN PATENT DOCUMENTS

CN 101510802 A 8/2009
CN 107305404 A 10/2017

(Continued)

OTHER PUBLICATIONS

Extended European Search Report for International Application No. 24152364.6 dated Jul. 2, 2024 in 8 pages.

(Continued)

*Primary Examiner* — Hafizur Rahman
(74) *Attorney, Agent, or Firm* — Knobbe, Martens, Olson & Bear, LLP

(57) ABSTRACT

Logarithmic current-to-voltage converters with emitter resistance compensation are disclosed herein. In certain embodiments, a logarithmic current-to-voltage converter includes a logarithmic bipolar transistor that converts an input current to a logarithmic voltage, and an emitter resistance compensation circuit that includes a replica of the logarithmic bipolar transistor. The emitter resistance compensation circuit processes a copy of the input current to generate an emitter resistance compensation signal that adjusts the logarithmic voltage to correct for an error introduced by an emitter resistance of the logarithmic bipolar transistor. By providing emitter resistance compensation in this matter, logarithmic current-to-voltage conversion with high accuracy and low log error is achieved.

20 Claims, 9 Drawing Sheets

(58) Field of Classification Search
USPC .......................................................... 330/296
See application file for complete search history.

(56) References Cited

U.S. PATENT DOCUMENTS

| | | | | |
|---|---|---|---|---|
| 3,992,622 | A | 11/1976 | Numata et al. | |
| 4,870,327 | A | 9/1989 | Jorgensen | |
| 5,200,655 | A | 4/1993 | Feldt | |
| 5,444,361 | A | 8/1995 | Ryat | |
| 5,489,868 | A | 2/1996 | Gilbert | |
| 5,578,958 | A | 11/1996 | Yasuda | |
| 6,417,702 | B1 | 7/2002 | Wang | |
| 6,980,052 | B1 | 12/2005 | Stroet | |
| 7,310,656 | B1 * | 12/2007 | Gilbert ..................... | G06G 7/24 708/851 |
| 7,375,576 | B2 | 5/2008 | Groiss | |
| 7,395,308 | B1 | 7/2008 | Gilbert | |
| 7,969,223 | B1 | 6/2011 | Gilbert | |
| 8,004,341 | B1 | 8/2011 | Gilbert | |
| 8,184,029 | B1 | 5/2012 | Hsieh et al. | |
| 8,207,776 | B1 | 6/2012 | Gilbert | |
| 9,099,137 | B2 | 8/2015 | Natzke et al. | |
| 9,306,531 | B2 | 4/2016 | Stroet | |
| 9,397,625 | B1 | 7/2016 | Gilbert | |
| 10,243,544 | B1 | 3/2019 | Gutnik | |
| 10,651,835 | B1 | 5/2020 | Gutnik | |
| 10,794,761 | B2 | 10/2020 | Young et al. | |
| 12,271,216 | B2 | 4/2025 | Stroet | |
| 2012/0091322 | A1 | 4/2012 | Kuroda | |
| 2013/0110896 | A1 | 5/2013 | Nakai | |
| 2015/0022267 | A1 | 1/2015 | Wurcer | |
| 2017/0017285 | A1 | 1/2017 | Kurokawa et al. | |
| 2020/0068149 | A1 | 2/2020 | Finateu et al. | |
| 2023/0409066 | A1 | 12/2023 | Stroet | |
| 2025/0070727 | A1 | 2/2025 | Stroet | |

FOREIGN PATENT DOCUMENTS

| | | | |
|---|---|---|---|
| EP | 0830731 | B1 | 3/1998 |
| JP | 2827397 | B2 | 11/1998 |
| JP | 3333239 | B2 | 10/2002 |
| JP | 2003133867 | A | 5/2003 |
| JP | 2004342950 | A | 12/2004 |
| KR | 100824376 | B1 | 4/2008 |
| KR | 2011-0091848 | A | 8/2011 |
| WO | WO2020199641 | A1 | 10/2020 |

OTHER PUBLICATIONS

B. Gilbert; “Limiting-Logarithmic Amplifiers”; Electronics Laboratories Advanced Engineering Course on RF IC Design for Wireless Communication Systems; Lausanne, Switzerland, Jul. 1995 in 126 pages.

* cited by examiner

LOGARITHMIC CURRENT TO VOLTAGE CONVERTERS WITH EMITTER RESISTANCE COMPENSATION

The present application claims priority to U.S. Provisional Patent Application No. 63/481,266, filed Jan. 24, 2023, and titled "LOGARITHMIC CURRENT TO VOLTAGE CONVERTERS WITH EMITTER RESISTANCE COMPENSATION," the entirety of which is hereby incorporated herein by reference.

FIELD OF THE DISCLOSURE

Embodiments of the invention relate to electronic systems, and more particularly to, electronic circuits for logarithmic conversion or detection.

BACKGROUND

Logarithmic converters or detectors provide an output signal that changes in relation to a logarithm of an applied input signal.

One type of logarithmic detector is a trans-linear logarithmic detector that uses the trans-linear properties of a bipolar transistor to provide logarithmic conversion. In one example, a collector and a base of an NPN bipolar transistor are directly connected to a gate and a source, respectively, of an n-type metal-oxide-semiconductor (NMOS) transistor. Additionally, an input current is applied to the collector of NPN bipolar transistor and the base of the NPN bipolar transistor generates a log voltage. Although such a circuit can provide logarithmic detection, the collector-to-base voltage of the NPN bipolar transistor is not very close to zero, leading to undesirable performance characteristics such as poor log-linear dynamic range for small input currents.

In another example of a trans-linear logarithmic detector, a collector and an emitter of an NPN bipolar transistor are directly connected to an inverting input and an output, respectively, of an operational amplifier (op-amp). Additionally, a base of the NPN bipolar transistor and a non-inverting input of the op-amp are grounded, while an input current is applied to the collector of NPN bipolar transistor such that the emitter of the NPN bipolar transistor generates a log voltage. By using the op-amp, the collector-to-base voltage of the NPN bipolar transistor can be controlled close to zero.

In certain applications, a second copy of a logarithmic detector is included and driven by a reference current, with a difference between the pair of logarithmic detectors taken to cancel the saturation current of the NPN bipolar transistor.

SUMMARY OF THE DISCLOSURE

Logarithmic current-to-voltage converters with emitter resistance compensation are disclosed herein. In certain embodiments, a logarithmic current-to-voltage converter includes a logarithmic bipolar transistor that converts an input current to a logarithmic voltage, and an emitter resistance compensation circuit that includes a replica of the logarithmic bipolar transistor. The emitter resistance compensation circuit processes a copy of the input current to generate an emitter resistance compensation signal that adjusts the logarithmic voltage to correct for an error introduced by an emitter resistance of the logarithmic bipolar transistor. By providing emitter resistance compensation in this matter, logarithmic current-to-voltage conversion with high accuracy and low log error is achieved.

In one aspect, a logarithmic current to voltage converter includes an input terminal configured to receive an input current, a logarithmic bipolar transistor having a collector connected to the input terminal and an emitter configured to generate a logarithmic output voltage, and an emitter resistance compensation circuit comprising a replica of the logarithmic bipolar transistor. The emitter resistance compensation circuit is configured to receive a copy of the input current and to generate a compensation signal operable to adjust the logarithmic voltage to correct for an error arising from an emitter resistance of the logarithmic bipolar transistor.

In another aspect, a photocurrent detection system includes a photodetector configured to generate an input current, and a semiconductor die including a logarithmic converter. The logarithmic converter includes an input terminal configured to receive the input current, a logarithmic bipolar transistor having a collector connected to the input terminal and an emitter configured to generate a logarithmic output voltage, and an emitter resistance compensation circuit comprising a scaled replica of the logarithmic bipolar transistor. The emitter resistance compensation circuit is configured to receive a scaled copy of the input current and to generate a compensation signal operable to adjust the logarithmic voltage to correct for an error arising from an emitter resistance of the logarithmic bipolar transistor.

In another aspect, a method of logarithmic current to voltage conversion is provided. The method includes providing an input current from an input terminal to a collector of a bipolar transistor, providing a logarithmic output voltage from an emitter of the logarithmic bipolar transistor, and generating a compensation signal using an emitter resistance compensation circuit that includes a scaled replica of the logarithmic bipolar transistor. Generating the compensation circuit includes receiving a scaled copy of the input current as an input to the emitter resistance compensation circuit and adjusting the logarithmic voltage to correct for an error arising from an emitter resistance of the logarithmic bipolar transistor using the compensation signal.

DETAILED DESCRIPTION

The following detailed description of embodiments presents various descriptions of specific embodiments of the invention. However, the invention can be embodied in a multitude of different ways. In this description, reference is made to drawings. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Figure 1A:
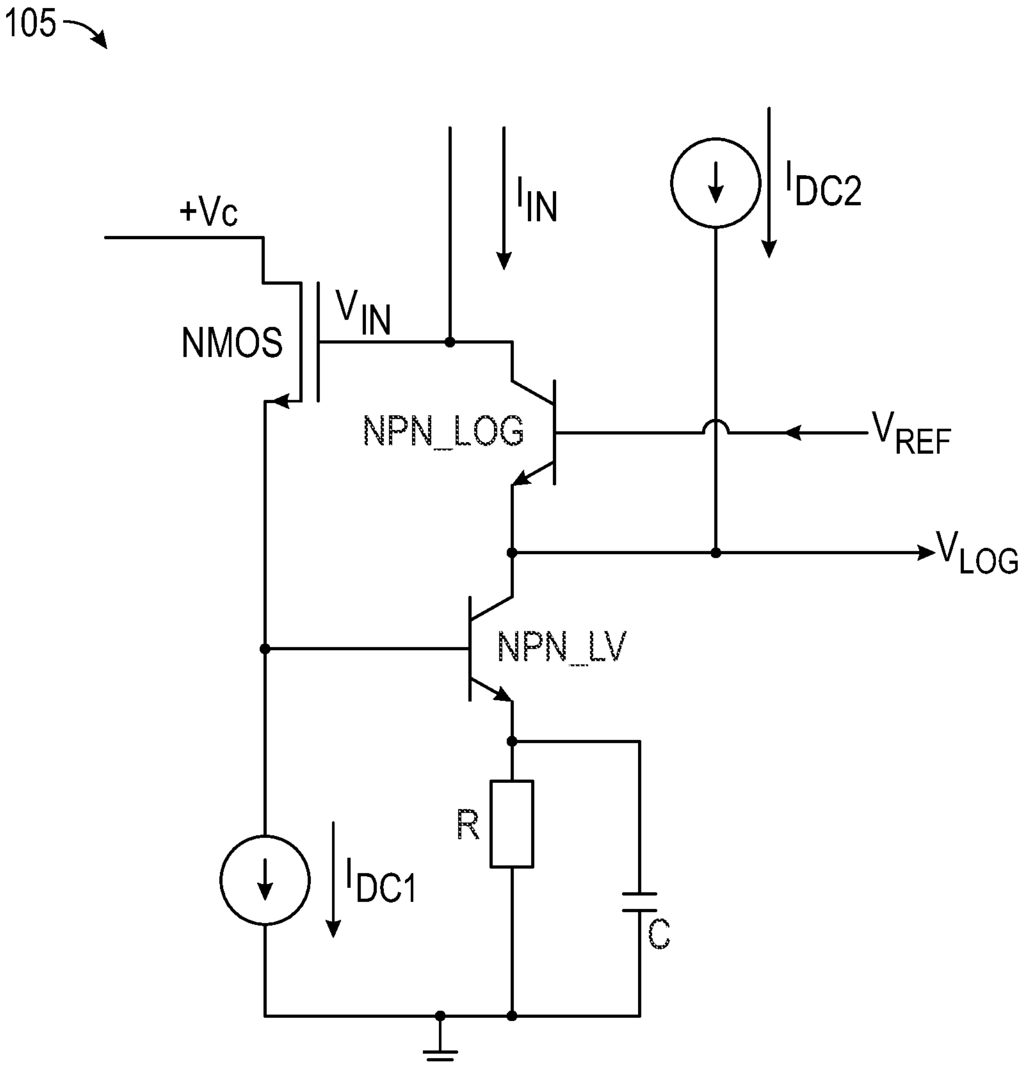
FIG. 1A is a schematic diagram of one embodiment of a logarithmic converter.

FIG. 1A is a schematic diagram of one embodiment of a logarithmic converter 105.

In the illustrated embodiment, the logarithmic converter 105 includes a FET transistor (NMOS, in this example), a first bipolar transistor NPN_LOG (n-type, in this example), a second bipolar transistor NPN_LV (n-type, in this example), a first DC current source $I_{DC1}$, a second DC current source $I_{DC2}$, a capacitor C, and a resistor R.

The NMOS transistor includes a drain that receives a power supply voltage +Vc, and a gate connected to a collector of the first bipolar transistor NPN_LOG and to an input terminal. The input terminal receives an input current $I_{IN}$ and has an input voltage VIN. The NMOS transistor further includes a source connected to a base of the second bipolar transistor NPN_LV and to the first DC current source $I_{DC1}$. Additionally, a base of the first bipolar transistor NPN_LOG receives a reference voltage $V_{REF}$ and an emitter of the first bipolar transistor NPN_LOG is connected to an output terminal that provides a logarithmic voltage $V_{LOG}$. The emitter of the first bipolar transistor NPN_LOG is also connected to the second DC current source $I_{DC2}$ and to a collector of the second bipolar transistor NPN_LV. The resistor R is connected between an emitter of the second bipolar transistor NPN_LV and ground, and the capacitor C is connected in parallel with the resistor R.

As shown in FIG. 1A, the input current $I_{IN}$ received from the input terminal is provided to the collector of the first bipolar transistor NPN_LOG. Additionally, the logarithmic converter 105 converts the input current $I_{IN}$ into the logarithmic voltage $V_{LOG}$, which is provided at the output terminal.

In the illustrated embodiment, the capacitor C operates to extend the bandwidth of the collector current over base voltage while the resistor R reduces the loop gain at high levels of the input current $I_{IN}$. In certain implementations, the capacitor C and/or the resistor R are controllable (for example, by using a capacitor array that is programmable to control a capacitance value and/or a resistor array that is programmable to control a resistance value).

The logarithmic converter 105 can achieve a higher speed relative to a configuration using an op-amp to provide feedback. For example, when an op-amp is included in the feedback loop, the additional components introduce extra phase shift that moves the second-order pole downwards in frequency. Although high value compensation capacitors can be added to keep such a feedback loop stable, high capacitance slows the circuit down.

Furthermore, the logarithmic converter 105 has superior noise performance at low levels of the input current $I_{IN}$ relative to an implementation with an op-amp in the feedback loop. For example, when an op-amp provides feedback at low input current levels, the bandwidth of the circuit reduces considerably, resulting in the loop gain to drop below 0 dB at a frequency below the baseband bandwidth of the rest of the circuit. This results in the loop not cancelling the bias noise sources in a significant manner. In that case, any noise voltage present on the reference voltage will be amplified significantly by the op-amp.

In contrast, any noise on the reference voltage $V_{REF}$ in FIG. 1A will be amplified much less since the amplification at the base of the first bipolar transistor NPN_LOG (which is connected as a common-base stage) is much lower.

Figure 1B:
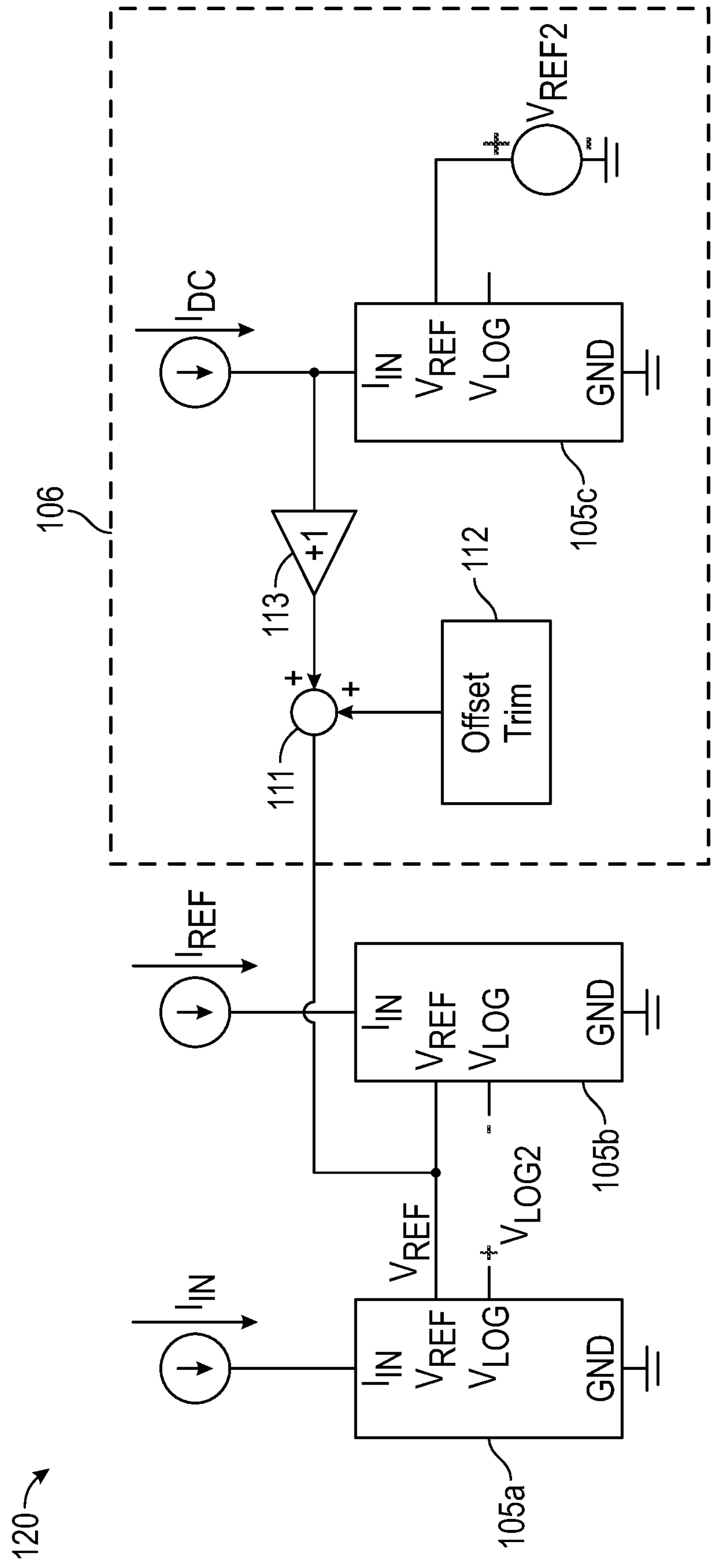
FIG. 1B is a schematic diagram of one embodiment of a logarithmic conversion system.

FIG. 1B is a schematic diagram of one embodiment of a logarithmic conversion system 120. The logarithmic conversion system 120 includes a first logarithmic converter 105*a*, a second logarithmic converter 105*b*, a reference current source $I_{REF}$, and a reference voltage source 106 that includes a third logarithmic converter 105*c*, a DC current source $I_{DC}$, a reference voltage source $V_{REF2}$, an adder 111, an offset trim circuit 112, and a buffer 113. The logarithmic conversion system 120 is also depicted with an input current source $I_{IN}$, which represents a photodiode or other input current source to the system 120.

As shown in FIG. 1B, multiple instantiations or replicas of the logarithmic converter 105 of FIG. 1A have been arranged to provide logarithmic current to voltage conversion with enhanced performance. In particular, the first logarithmic converter 105*a* serves as an input channel, the second logarithmic converter 105*b* serves as a reference channel, and the third logarithmic converter 105*c* serves as a DC channel.

In the illustrated embodiment, the DC current from the DC current source $I_{DC}$ is provided as an input to the third logarithmic converter 105*c*, which is biased by the reference voltage source $V_{REF2}$. Additionally, the buffer 113 buffers the input voltage to the third logarithmic converter 105*c*. The buffered voltage from the buffer 113 is trimmed by the offset trim circuit 112 to generate a reference voltage $V_{REF}$ for the first logarithmic converter 105*a* and the second logarithmic converter 105*b*.

By implementing the logarithmic conversion system 120 in this manner, high dynamic range is achieved by setting the voltage reference $V_{REF}$ in such a manner that the collector-to-emitter voltages (of bipolar transistors NPN_LOG within the converters 105*a* and 15*b*) are close to zero. In particular, the logarithmic conversion system 120 applies a DC current to the third logarithmic converter 105*c*, which is biased with the reference voltage source $V_{REF2}$. The precision of the reference voltage source $V_{REF2}$ can be relaxed compared to a precision of the reference voltage $V_{REF}$ since the DC current from the DC current source $I_{DC}$ can be scaled to be much higher than a minimum value of the input current $I_{IN}$.

With continuing reference to FIG. 1B, the input channel (the first logarithmic converter 105*a*), the reference channel (the second logarithmic converter 105*b*), and the DC channel (the third logarithmic converter 105*c*) can be scaled in size to provide enhanced performance. In one implementation, the input channel and the reference channel have a scaling factor 8 while the DC channel has a scaling factor 2. Although one example of scaling factors is provided, other scaling factors can be used.

Since the DC current from the DC current source $I_{DC}$ can be chosen to be in the middle of the dynamic range of the input current source $I_{IN}$ (for instance, 10 μA), larger deviations around zero of the collector-base voltage of bipolar transistor NPN_LOG has little to no impact on accuracy.

As shown in FIG. 1B, the log voltage $V_{LOG\ 2}$ is taken differentially between the $V_{LOG}$ outputs of the first logarithmic converter 105*a* and the second logarithmic converter 105*b*. By using a differential voltage between the input channel and the reference channel, the saturation current of the bipolar transistors (NPN_LOG transistors within converters 105*a* and 105*b*) is canceled.

In the illustrated embodiment, the buffer 113 is a voltage buffer with unity gain (+1). The buffer 113 is applied to the input voltage of the DC channel to bias the input and reference channels ($V_{REF}$ voltages). The offset trim circuit 112 can be used to correct for mismatches and/or for the difference between the DC current in the DC channel and the lowest input current in the input channel.

Moreover, in certain embodiments, the offset trim circuit 112 applies a correction voltage, such as a proportional to temperature (PTAT) voltage (for instance, around 50 mV) which is added to the reference voltage $V_{REF}$ to correct for low input current $I_{IN}$ and/or high temperature deviations.

Absent compensation, the logarithmic conversion circuits of FIGS. 1A and 1B can suffer from logarithmic error introduced by the emitter resistance (RE) of the transistor used for logarithmic current-to-voltage conversion.

For example, an optical log converter uses the logarithmic relationship between the base-emitter voltage ($V_{BE}$) and the collector current ($I_C$) of a bipolar junction transistor. Additionally, a log amp that employs this property of a bipolar transistor is referred to as a logarithmic trans-impedance amplifier.

With reference back to FIGS. 1A and 1B, the bipolar transistor of an input channel (the first logarithmic converter 105*a* of FIG. 1B) can have a first emitter resistance RE1, and the bipolar transistor of a reference channel (the second logarithmic converter 105*b* of FIG. 1B) can have a second emitter resistance RE2. If RE1≠0 and RE2≠0 an error is introduced causing the $V_{LOG}$ curve to change at the higher end of the input current range.

Logarithmic current-to-voltage converters with emitter resistance compensation are disclosed herein. In certain embodiments, a logarithmic current-to-voltage converter includes a logarithmic bipolar transistor that converts an input current to a logarithmic voltage, and an emitter resistance compensation circuit that includes a replica of the logarithmic bipolar transistor. The emitter resistance compensation circuit processes a copy of the input current to generate an emitter resistance compensation signal that adjusts the logarithmic voltage to correct for an error introduced by an emitter resistance of the logarithmic bipolar transistor.

By providing emitter resistance compensation in this matter, logarithmic current-to-voltage conversion with high accuracy and low log error is achieved.

Figure 2:
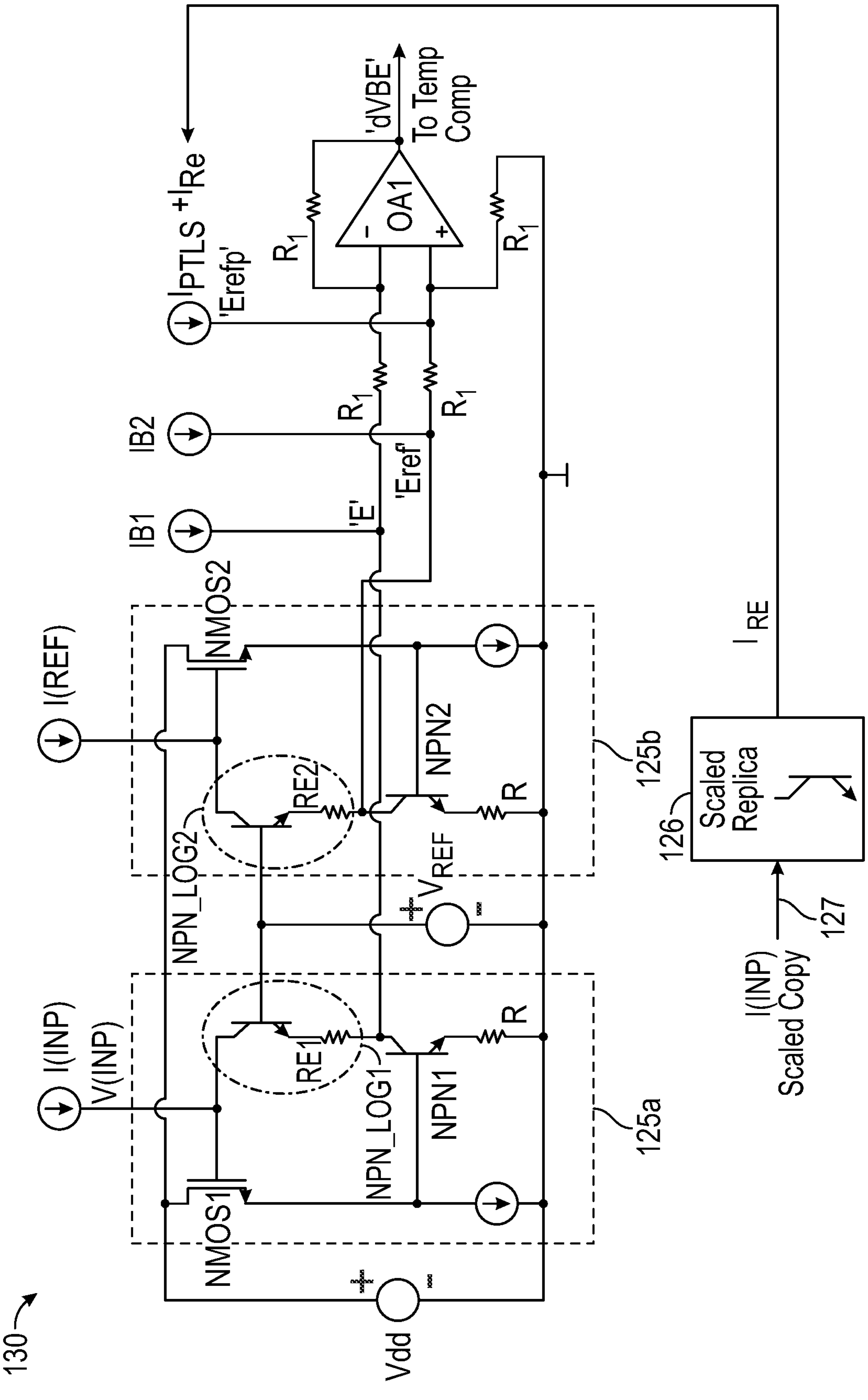
FIG. 2 is a schematic diagram of one embodiment of a logarithmic conversion system with emitter resistance compensation.

FIG. 2 is a schematic diagram of one embodiment of a logarithmic conversion system 130 with emitter resistance compensation. The logarithmic conversion system 130 includes an input channel 125*a* (receiving an input current I(INP)), a reference chancel 125*b*, a reference voltage source $V_{REF}$, a reference current source $I_{REF}$ (provided to the reference channel 125*b*), and an output amplifier (OA1, which can be an operational amplifier) for processing a differential logarithmic voltage provided across the output nodes (E and Eref) of the input channel 125*a* and the reference chancel 125*b*.

The output amplifier OA1 is biased by various current sources (IB1, IB2, and $I_{PTLS}+I_{Re}$) as shown, and includes input resistors (of resistance R1) at each of the positive and negative inputs, a feedback resistor (of resistance R1) from output to negative input, and a bias resistor (of resistance R1) from the positive input to ground. The output amplifier OA1 serves to output the difference voltage between E and Eref plus an offset to generate a unipolar logarithmic signal, which in certain implementations is processed by an analog temperature compensation circuit to compensate for absolute temperature T.

The input channel 125*a* and the reference channel 125*b* have a configuration similar to that of FIG. 1A, except that particular example resistance values are depicted and the parasitic emitter resistances of the bipolar transistors NPN_LOG 1 and NPN_LOG 2 are shown. In particular, the input channel 125*a* includes logarithmic bipolar transistor NPN_LOG 1 with a first emitter resistance RE1, while the reference channel 125*b* includes reference bipolar transistor NPN_LOG 2 with a second emitter resistance RE2.

If RE1≠0 and RE2≠0 an error is introduced causing the V LOG curve to change at the higher end of the input current range. This is caused by a voltage drop over RE1 that lowers the E node voltage at high input currents and thus increases V (Eref−E) by a value of $V_{Re}$=RE1·I(INP). Typically, RE2 doesn't introduce a significant error because the internal reference current is sufficiently low not to affect V(Eref−E) much. However, if the reference current is sourced externally, for example in current-ratio applications, RE2 can introduce a significant error as well if I(IREF) is high.

The logarithmic conversion system 130 includes the emitter resistance compensation circuit 126 to compensate for this effect. In the illustrated embodiment, the emitter resistance compensation circuit 126 includes a scaled replica or copy of the logarithmic bipolar transistor NPN_LOG 1. The scaled replica processes a copy 127 of the input current (IINP), which can be scaled down in value to reduce power dissipation. The emitter resistance compensation circuit 126 processes the input current copy 127 to generate an emitter resistance compensation signal for compensating the logarithmic voltage of the logarithmic conversion system 130.

In the illustrated embodiment, the emitter resistance compensation signal corresponds to a correction current IRE that is provided to a positive input of the output amplifier OA1 to provide a correction to the logarithmic voltage. However, other types of correction signal schemes can be used.

Any suitable circuit (for example, any suitable current mirror) can provide the scaled replica of the input current to the emitter resistance compensation circuit 126.

Figure 3:
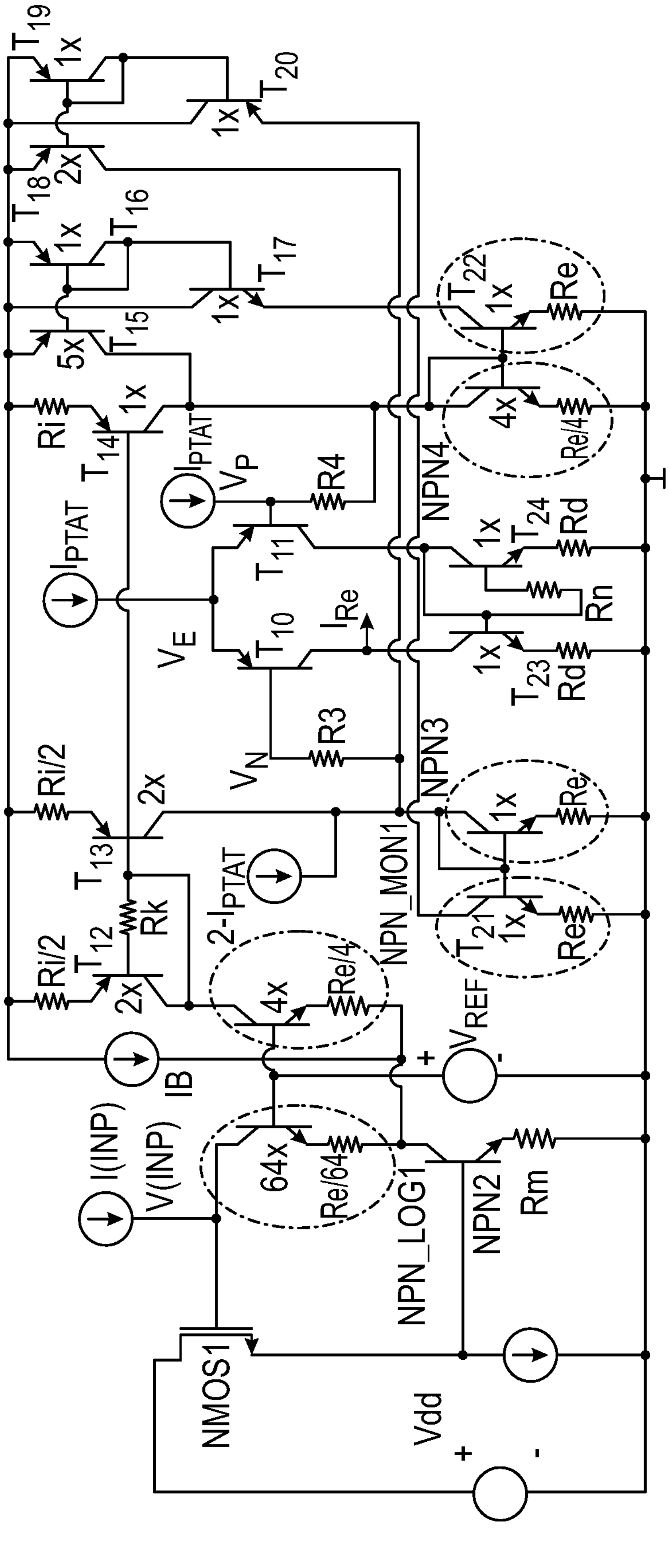
FIG. 3 is a schematic diagram of one embodiment of an emitter resistance compensation circuit.

FIG. 3 is a schematic diagram of one embodiment of an emitter resistance compensation circuit. In this example, the emitter resistance compensation circuit includes two replica transistors (replicas of the logarithmic bipolar transistor NPN_LOG 1 of FIG. 2) with a large current density ratio driven by a scaled down copy of the input current compensated by the natural logarithm of the current density ratio multiplied by a thermal voltage. By implementing the emitter resistance compensation circuit in this manner, a compensation signal (IRE, in this example) proportional with the emitter resistance times the input current is generated.

Because the replica transistor's emitter resistance is matching the logging transistor's emitter resistance with a scaling factor, the accuracy of the compensation versus process and temperature is improved as compared to using a discrete resistor in the compensation circuit.

Thus, a lower scaled copy of the input current I(INP) is provided by the collector current of NPN_MON1. NPN_LOG 1 is the same device in both FIGS. 2 and 3.

The circles in FIG. 3 indicate that the emitter resistance (fraction) is part of the transistor itself, not a separate component.

NPN3 receives a collector current of I(INP)/32 plus a PTAT current $2 \cdot I_{PTAT}$. Additionally, the current density in NPN3 is 4 times the current density in NPN_LOG 1 at high input currents I(INP). Furthermore, NPN4 receives a collector current of I(INP)/64 plus a current $I_{PTAT}$.

With continuing reference to FIG. 3, a PTAT voltage $V_{R4}$ equal to the natural logarithm of the ratio of the current densities of NPN3 and NPN4 times a thermal voltage $$V_T = \frac{k \cdot T}{q}$$

is added to the NPN4 base-emitter voltage.

Furthermore, a PNP differential pair receives the NPN3 base-emitter voltage and the NPN4 base-emitter voltage+$V_{R4}$ as an input.

The PTAT current is given by:

$$I_{PTAT} = \frac{k \cdot T}{q \cdot 4 \cdot R_1} LN(A)$$

with A=8 the emitter ratio and 4·R1 the resistor that sets the current in the bandgap of the PTAT current generator.

For I(INP)=0 the differential pair input voltage $V_N$ is given by $$V_N = \frac{k \cdot T}{q} \cdot \mathrm{LN}\left(\frac{I(INP)/16 + 2 \cdot I_{PTAT}}{I_S}\right) + R_e \cdot (2 \cdot I_{PTAT} + I(INP)/16).$$

This can be expressed as $$V_N = \frac{k \cdot T}{q} \cdot \mathrm{LN}\left(\frac{I(INP)/16 + 2 \cdot I_{PTAT}}{4 \cdot I_S}\right) + \frac{k \cdot T}{q} \cdot \mathrm{LN}(4) + 2 \cdot R_e \cdot (I_{PTAT} + I(INP)/32),$$

or $$V_N = term1n + term2n + term3n.$$

Assuming base currents for $T_{10}$ and $T_{11}$ are zero, the voltage drop over $R_4$ is $$V_{R4} = I_{PTAT} \cdot R_4 = \frac{k \cdot T}{q \cdot 4 \cdot R_1} \mathrm{LN}(8) \cdot 4 \cdot R_1 = \frac{k \cdot T}{q} \cdot \mathrm{LN}(8).$$

For I(INP)=0 the differential pair input voltage $V_P$ is given by $$V_P = \frac{k \cdot T}{q} \cdot \mathrm{LN}\left(\frac{I(INP)/32 + I_{PTAT}}{4 \cdot I_S}\right) + \frac{k \cdot T}{q} \cdot \mathrm{LN}(8) + 0.25 \cdot R_e \cdot (I_{PTAT} + I(INP)/32).$$

This can be expressed as $$V_P = \frac{k \cdot T}{q} \cdot \mathrm{LN}\left(\frac{I(INP)/16 + 2 \cdot I_{PTAT}}{4 \cdot I_S}\right) + \frac{k \cdot T}{q} \cdot \mathrm{LN}(0.5) + \frac{k \cdot T}{q} \cdot \mathrm{LN}(A) + 0.25 \cdot R_e \cdot (I_{PTAT} + I(INP)/32)$$

or $V_P$=term1p+term2p+term3p+term4p, where term1p−term1n=0.

With continuing reference to FIG. 3, $$term2p + term3p - term2n = \frac{kT}{q} \cdot \mathrm{LN}(0.5) + \frac{k \cdot T}{q} \cdot \mathrm{LN}(8) - \frac{k \cdot T}{q} \cdot \mathrm{LN}(4) = \frac{k \cdot T}{q} \cdot \mathrm{LN}(1) = 0.$$

Additionally, rm4p−term3n=0.25·$R_e$·($I_{PTAT}$+I(INP)/32)−2·$R_e$·($I_{PTAT}$+I(INP)/32), and $V_P$−$V_N$=term4p−term3n=−1.75·$R_e$·($I_{PTAT}$+I(INP)/32).

Accordingly, transistors $T_{15}$ to $T_{22}$ and resistors Rk, Rn and $R_3$ are for base current compensation. Additionally, the differential pair output current can drive the positive input of the amplifier OA1 of FIG. 2.

The output voltage of the input stage and level shifter with $R_e$=64·RE1 is given by $$dVBE = V(Eref - E) + I(INP) \cdot R_e / 64 + I_{Re} \cdot R_1 + I_{PTLS0} \cdot \frac{T}{T_0} \cdot R_1,$$

where $I_{PTLS0}$ is the PTAT level-shift current $I_{PTLS}$ at temperature T=$T_0$ and $R_e$=64·RE1 and RE2·I(IREF)<<1 mV.

Furthermore, $$I_{Re} = I_{PTAT} \cdot \tanh\left(\frac{V_P - V_N}{2 \cdot V_T}\right)$$

for $$|V_N - V_P| < V_T\text{: } I_{Re} \approx \frac{q \cdot (V_P - V_N)}{2 \cdot k \cdot T} \cdot I_{PTAT}.$$

Additionally, $$I_{PTAT} = \frac{k \cdot T}{q \cdot 4 \cdot R_1} LN(8) \approx \frac{k \cdot T}{q \cdot 2 \cdot R_1}$$

and $$I_{Re} \approx \frac{q \cdot (V_P - V_N)}{2 \cdot k \cdot T} \cdot \frac{k \cdot T}{q \cdot 2 \cdot R_1} = \frac{V_P - V_N}{4 \cdot R_1}.$$

With continuing reference to FIG. 3, $$V_P - V_N = -1.75 \cdot R_e \cdot (I_{PTAT} + I(INP)/32 = -1.75 \cdot R_e \cdot I_{PTAT} - 7/128 \cdot R_e \cdot I(INP).$$

Additionally, $$I_{Re} \cdot R_1 = \frac{V_P - V_N}{4} = -7/16 \cdot R_e \cdot (I_{PTAT} + I(INP)/32) = -7/16 \cdot R_e \cdot I_{PTAT} - 7/512 \cdot R_e \cdot I(INP)$$

and $$I(INP) \cdot R_e / 64 + I_{Re} \cdot R_1 = (8/512 - 7/512) \cdot R_e \cdot I(INP) - 0.4375 \cdot R_e \cdot I_{PTAT}.$$

Thus, with emitter resistance compensation I(INP)·$R_e$/64+$I_{Re}$·$R_1$=(8⁄512−7⁄512)·$R_e$·I(INP)−0.4375·$R_e$·$I_{PTAT}$, and $$dVBE = V(Eref-E) + 1/512 \cdot R_e \cdot I(INP) - 0.4375 \cdot R_e \cdot I_{PTAT} + I_{PTLS0} \cdot \frac{T}{T_0} \cdot R_1.$$

Compared to dVBE without compensation, error due to $R_e$ is reduced by a factor of 512/64=8.

With reference to FIGS. 2 and 3, without emitter resistance compensation, the input stage output voltage of FIG. 2 is given by $$dVBE = V(Eref-E) + 1/64 \cdot R_e \cdot I(INP) + I_{PTLS0} \cdot \frac{T}{T_0} \cdot R_1.$$

Due to the $R_e$ compensation, an offset is introduced with value $V_{OS}=-7/16 \cdot R_e \cdot I_{PTAT}$.

Additionally, $$dBx = 20 \cdot \mathrm{Log}_{10}\left(\frac{I(INP)}{I(IREF)}\right) = \frac{20 \cdot q}{k \cdot T \cdot \mathrm{LN}(10)} \cdot V(Eref-E)$$

and $$I_{PTAT} = \frac{k \cdot T}{q \cdot 4 \cdot R_1} LN(8) \approx \frac{k \cdot T}{q \cdot 2 \cdot R_1} \Rightarrow V_{OS} = -7/16 \cdot R_e \cdot \frac{k \cdot T}{q \cdot 2 \cdot R_1}.$$

A dB value dBxos can be assigned to this offset to be $$dBxos = \frac{20 \cdot q}{k \cdot T \cdot \mathrm{LN}(10)} \cdot -7/16 \cdot \frac{k \cdot T}{q \cdot 2 \cdot R_1} \cdot R_E = \frac{-35}{8 \cdot \mathrm{LN}(10)} \cdot \frac{R_e}{R_1} \approx -1.9 \cdot \frac{R_e}{R_1}.$$

For typical values for $R_e$=64 and $R_1$=4000, the offset will be −0.03 dB. This offset is temperature independent as long as $R_e$ is temperature independent and can be reduced or eliminated by calibration.

Moreover, by changing the shared bias current of $T_{10}$ and $T_{11}$ from $I_{PTAT}$ to $$\frac{16}{7 \cdot LN(8)} \cdot I_{PTAT} \approx 1.1 \cdot I_{PTAT},$$

the $R_e \cdot I(INP)$ term would be zero. The shared bias current of $T_{10}$ and $T_{11}$ can be chosen less than PTAT which reduces the effect of more pronounced peaking at cold and high input currents.

By including the emitter resistance compensation circuit of FIG. 3, the output voltage of the input stage of FIG. 2 is now given by $$dVBE = V(Eref-E) + 1/512 \cdot R_e \cdot I(INP) - 0.4375 \cdot R_e \cdot I_{PTAT} + I_{PTLS0} \cdot \frac{T}{T_0} \cdot R_1.$$

Accordingly, the error introduced by emitter resistance is decreased by a factor of 8.

Moreover, a new factor of $-0.4375 \cdot R_e \cdot I_{PTAT}$ introduces an offset in dB of $$dBxos \approx -1.9 \cdot \frac{R_e}{R_1}[\mathrm{dB}],$$

which typically is small and can be eliminated by calibration.

With reference back to FIG. 2, we can define $$dBx = 20 \cdot \mathrm{Log}_{10}\left(\frac{I(INP)}{I(REF)}\right) = \frac{20 \cdot q}{k \cdot T \cdot LN(10)} \cdot V(Eref-E)$$

[hereinafter Equation 1] with dBx the ratio in dB between I(INP) and/(IREF), assuming RE1=0 and RE2=0 and $LN(x)=Log_e(x)$.

In log ratio applications, both I(INP) and I(IREF) may each vary over the full specified range of 1 nA to 10 mA. However, in default operation, the reference current is generated internally. It is defined as $I_{REF}$ if this current is internally generated. $I_{REF}$ is trimmed for best V LOG vs I(INP) logarithmic conformance. Thus, $$V(Eref-E) = \frac{dBx \cdot k \cdot T \cdot LN(10)}{20 \cdot q}.$$

Equation 2 shows that the V(Eref–E) is still proportional-to-absolute-temperature (PTAT) and temperature variation of k·T/q is subsequently eliminated by temperature compensation circuitry that essentially puts a variable proportional to absolute temperature underneath the T in Equation 2 and raising the magnitude to a stable value of 10 mV/dB or 200 mV/decade. Therefore, for photodiode applications, using this correction the relationship between a photodiode current, $I_{PD}$, applied to the INP pin, and the voltage appearing at the output at V LOG is given by V LOG=$V_Y \cdot Log_{10}(I_{PD}/I_{NT})$ [hereinafter Equation 3]. Here, $V_Y$ is the log slope voltage (and, for the case of base-10 logarithms, it is also the volts per decade) and $I_{INT}$ is the extrapolated log X-axis intercept.

The output at V LOG can also be expressed as $$VLOG = 0.01 \cdot dBx = \frac{0.2 \cdot q}{k \cdot T \cdot LN(10)} \cdot V(Eref-E).$$

The relationship between $V_Y$ and V(Eref–E) is 3.33 at T=302.4K in the default configuration. For a factor of 10 between I(INP) and $I_{REF}$, V(Eref–E)=60 mV at T=302.4K, resulting in a slope of 0.2 V/decade.

In certain implementations, during fabrication, $V_Y$ is set to 0.2 V/decade (10 mV/dB) and $I_{INT}$=10 pA by factory trim.

The output at V LOG can further be expressed as V LOG=0.2 V·$Log_{10}(I_{PD}/10\ pA)$ [hereinafter Equation 5]. The output for the value of $I_{PD}$ can be calculated using Equation 5. For example, for $I_{PD}$=10 nA, the output V LOG has a value of 0.6 V. When $I_{PD}$=100 pA, the output V LOG has a value of 0.2 V.

Figure 4:
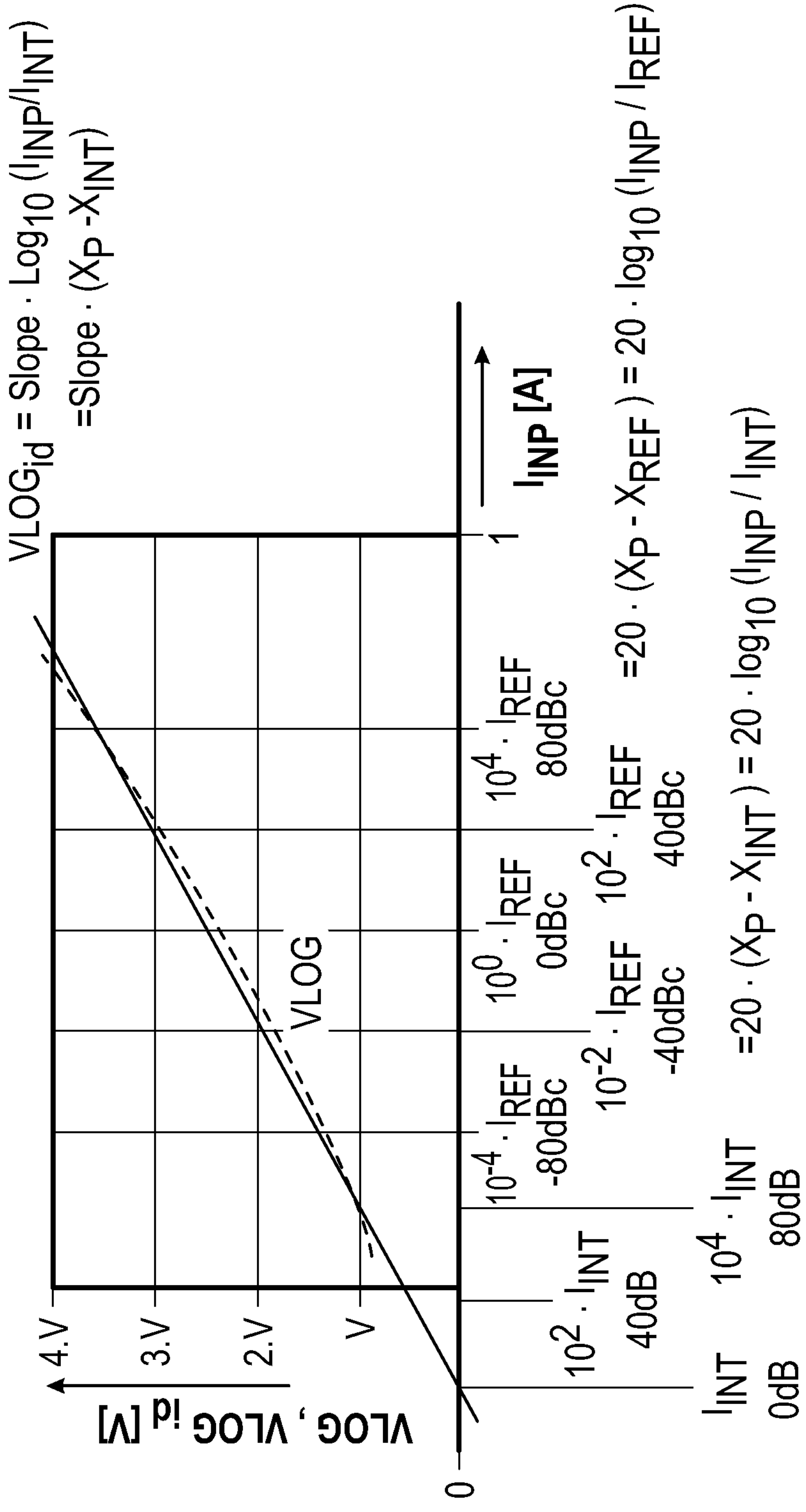
FIG. 4 is a graph of one example of logarithmic output voltage versus input current.

FIG. 4 is a graph of one example of logarithmic output voltage versus input current. The graph shows the input/output relation of an ideal log-amp. Horizontal scale is logarithmic and spans a wide dynamic range. Output passes through zero at $I_{INP}=I_{INT}$.

The emitter resistance compensation schemes herein correct errors in the input/output relation of a log-amp arising from emitter resistance.

For example, if RE1≠0 and RE2≠0, an error is introduced causing the V LOG curve to change at the higher end of the input current range. This is caused by a voltage drop over RE1 that lowers the 'E' node voltage at high input currents and thus increases V(Eref–E) by a value of $V_{Re}$=1/64·$R_e$·I (INP), with $R_e$=64·RE1.

$$\text{Thus, } dVBE = V(Eref - E) + 1/64 \cdot R_e \cdot I(INP) + I_{PTLS0} \cdot \frac{T}{T_0} \cdot R_1.$$

Typically, RE2 doesn't introduce a significant error because the internal reference current is low enough not to affect V(Eref–E) much. If the reference current is sourced externally, for example in current-ratio applications, RE2 can introduce a significant error as well if (IREF) is high.

From Equation 1 above, at T=302.4K the logarithmic error is 0.333 dB/mV drop over RE1.

Figure 5:
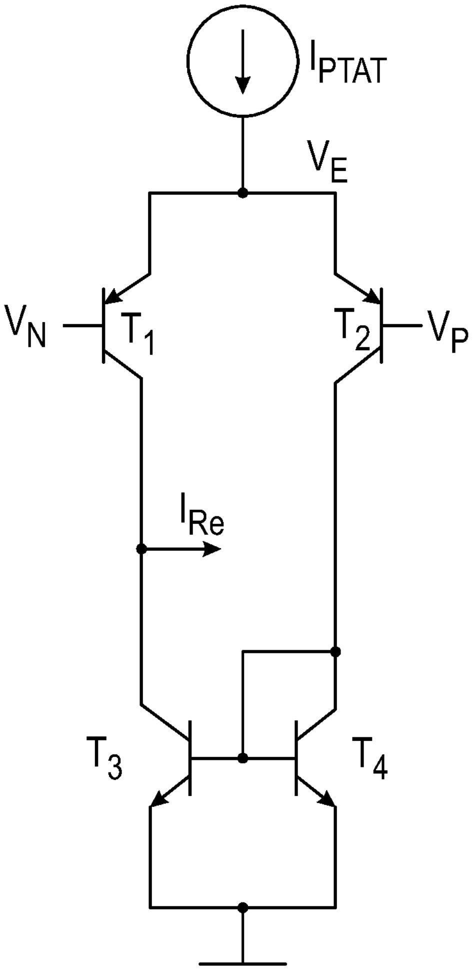
FIG. 5 is a schematic diagram of one example of a bipolar differential pair.

FIG. 5 is a schematic diagram of one example of a bipolar differential pair, in which T1/T2 are equal area and T3/T4 are equal area.

With reference to FIG. 5, $$I_{C1} \approx I_S \cdot e^{\frac{V_E - V_N}{V_T}}$$

and $$I_{C2} \approx I_S \cdot e^{\frac{V_E - V_P}{V_T}}$$

for $I_{C1}$, $I_{C2}$>>$I_S$, where $$V_T = \frac{k \cdot T}{q}$$

with Boltzmann's constant k, electron charge q and absolute temperature T.

Thus, $$I_{C1} \approx I_S \cdot e^{\frac{V_E - V_N}{V_T}}$$

and $$I_{C2} \approx I_S \cdot e^{\frac{V_E - V_P}{V_T}}$$

for $I_{C1}$, $I_{C2}$>>$I_S$. Additionally, $$I_{C1} + I_{C2} = I_{PTAT} \text{ and } I_{C1} - I_{C2} = I_{Re},$$

$$I_{C1} = \frac{I_{PTAT}}{1 + e^{\frac{V_E - V_N}{V_T}}} \text{ and } I_{C2} = \frac{I_{PTAT}}{1 + e^{\frac{V_P - V_E}{V_T}}}.$$

Furthermore, $$I_{Re} = I_{PTAT} \cdot \frac{e^{\frac{V_P - V_E}{V_T}} - 1}{e^{\frac{V_P - V_N}{V_T}} + 1} = I_{PTAT} \cdot \tanh\left(\frac{V_P - V_N}{2 \cdot V_T}\right), \text{ and}$$

$$\frac{d}{dx}\tanh(x) = 1/\cosh^2(x) \text{ for } x = 0,\ 1/\cosh^2(x) = 1.$$

$$\text{For } |V_P - V_N| < V_T: I_{Re} \approx \frac{V_P - V_N}{2 \cdot V_T}.$$

Figure 6:
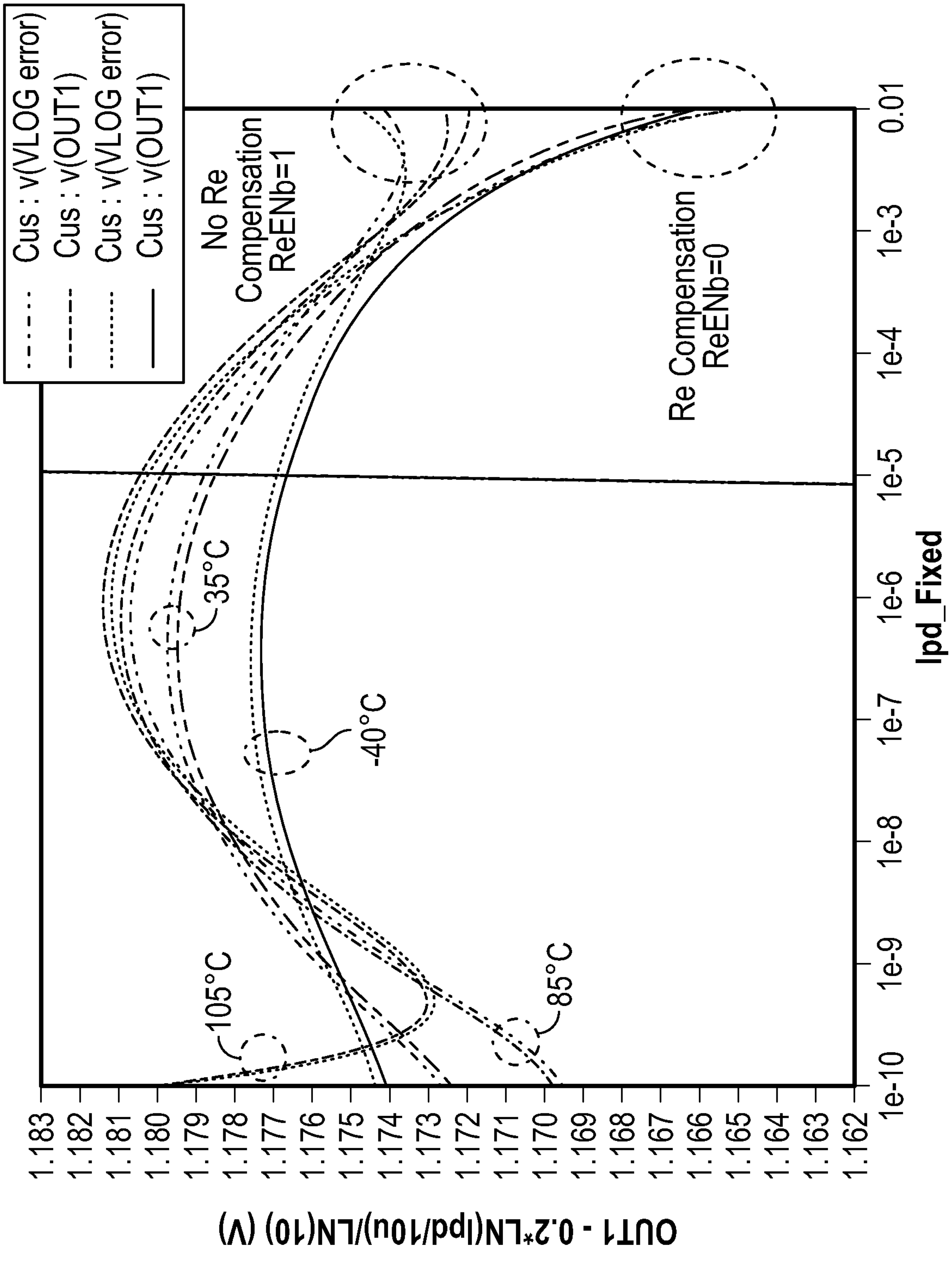
FIG. 6 is a graph of one example of an emitter resistance compensation simulation.

FIG. 6 is a graph of one example of an emitter resistance compensation simulation. The simulation simulates one implementation of emitter resistance compensation for different temperature values. Simulations with and without emitter resistance compensation are enabled are shown.

Figure 7:
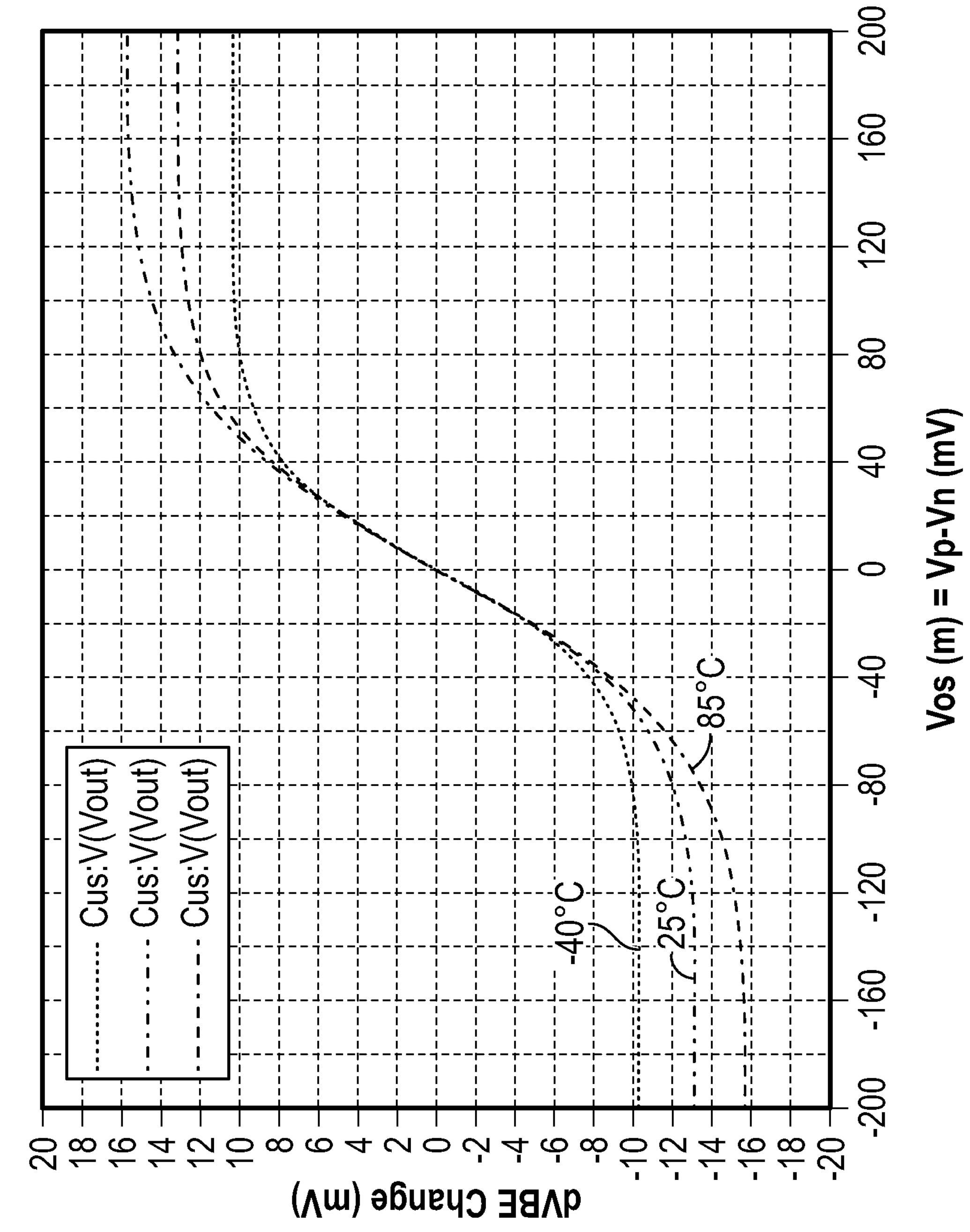
FIG. 7 is a graph of one example of base-to-emitter voltage change versus differential voltage.

FIG. 7 is a graph of one example of dVBE voltage change versus differential voltage $V_P$–$V_N$. The graph uses a PTAT tail current for the differential pair T10 and T11 in FIG. 3 with value $$I_{PTAT} = \frac{k \cdot T}{q \cdot 4 \cdot R_1} LN(8)$$

and $K_1$ around OA1 in FIG. 2. For small input voltages for the T10 & T11 differential pair up to 20 mV, the dVBE output voltage change is independent with temperature. The gain is chosen 0.25 because the current density of NPN3 is 4× the current density in NPN_LOG 1. An accurate compensation can be achieved up to 5 mV dVBE. With an emitter resistance RE1 of for example 1Ω, about up to 5 mA can be compensated accurately.

Figure 8:
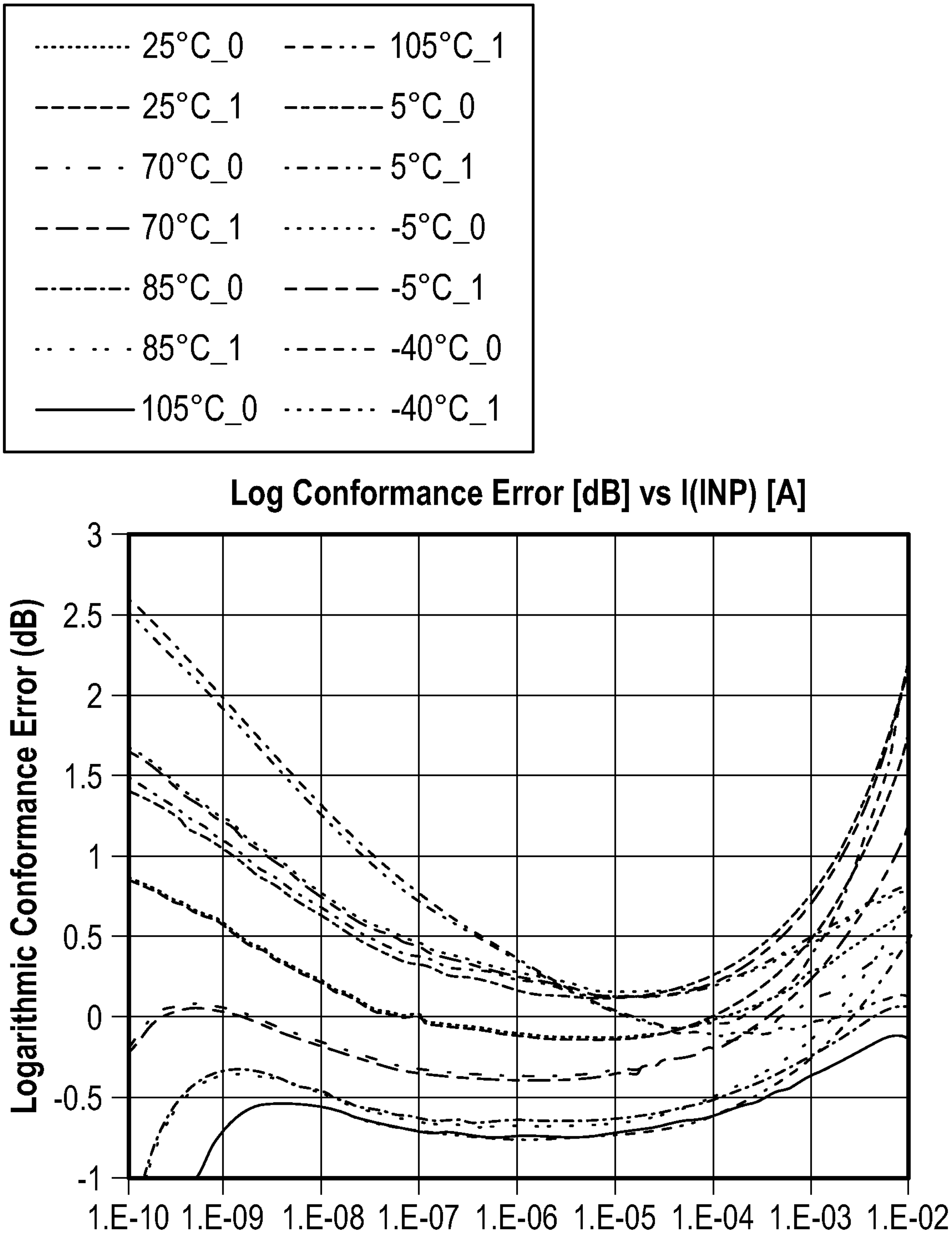
FIG. 8 is a graph of one example of logarithmic conformance error versus input current.

FIG. 8 is a graph of one example of logarithmic conformance error versus input current. The dashed line is with Re compensation off. The graph uses a tail current for the differential pair T10 and T11 in FIG. 3 with value closer to constant vs temperature (ZTAT) than PTAT.

As shown in FIG. 8, the difference between Re Compensation On and Off is larger at cold temperature. Additionally, Re Compensation is not cause of downward slope at –40° C.

CONCLUSION

The foregoing description may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while the disclosed embodiments are presented in a given arrangement, alternative embodiments may perform similar functionalities with different components and/or circuit topologies, and some elements may be deleted, moved, added, subdivided, combined, and/or modified. Each of these elements may be implemented in a variety of different ways. Any suitable combination of the elements and acts of the various embodiments described above can be combined to provide further embodiments. Accordingly, the scope of the present invention is defined only by reference to the appended claims.

Although the claims presented here are in single dependency format for filing at the USPTO, it is to be understood that any claim may depend on any preceding claim of the same type except when that is clearly not technically feasible.

What is claimed is:

1. A logarithmic current to voltage converter comprising:
- an input terminal configured to receive an input current;
- a logarithmic bipolar transistor having a collector connected to the input terminal and an emitter configured to generate a logarithmic output voltage;
- an emitter resistance compensation circuit comprising a replica of the logarithmic bipolar transistor, wherein the emitter resistance compensation circuit is configured to receive a copy of the input current and to generate a compensation signal operable to adjust the logarithmic voltage to correct for an error arising from an emitter resistance of the logarithmic bipolar transistor; and
- a bipolar transistor having a collector connected to the emitter of the logarithmic bipolar transistor.

2. The logarithmic current to voltage converter of claim 1, wherein the compensation signal is proportional to the emitter resistance.

3. A logarithmic current to voltage converter comprising:
- an input terminal configured to receive an input current;
- a logarithmic bipolar transistor having a collector connected to the input terminal and an emitter configured to generate a logarithmic output voltage; and
- an emitter resistance compensation circuit comprising a replica of the logarithmic bipolar transistor, wherein the emitter resistance compensation circuit is configured to receive a copy of the input current and to generate a compensation signal operable to adjust the logarithmic voltage to correct for an error arising from an emitter resistance of the logarithmic bipolar transistor,
- wherein the emitter resistance compensation circuit comprises a pair of bipolar transistors configured to sense a difference voltage that changes based on the emitter resistance of the logarithmic bipolar transistor times a scaled copy of the input current.

4. The logarithmic current to voltage converter of claim 3, wherein the difference voltage is sensed between a pair of scaled replica transistors with a current density ratio of at least four to one.

5. The logarithmic current to voltage converter of claim 4, wherein the difference voltage is corrected by a voltage that is proportional to a natural logarithm of the current density ratio times a thermal voltage.

6. The logarithmic current to voltage converter of claim 3, wherein the pair of bipolar transistors is biased by a current that is proportional to absolute temperature (PTAT).

7. The logarithmic current to voltage converter of claim 1, wherein the copy of the input current is scaled down in size relative to the input current.

8. The logarithmic current to voltage converter of claim 1, wherein the replica of the logarithmic bipolar transistor is scaled down in size relative to the logarithmic bipolar transistor.

9. The logarithmic current to voltage converter of claim 1, further comprising a logarithmic bipolar transistor having a collector configured to receive a reference current, wherein the logarithmic output voltage is taken differentially between the emitter of logarithmic bipolar transistor receiving the input current and an emitter of the logarithmic bipolar transistor receiving the reference current.

10. The logarithmic current to voltage converter of claim 9, further comprising an output amplifier configured to receive the logarithmic output voltage between a first input and a second input.

11. The logarithmic current to voltage converter of claim 9, wherein the compensation signal is a compensation current provided to the first input of the output amplifier.

12. A photocurrent detection system comprising:
- a photodetector configured to generate an input current; and
- a semiconductor die comprising a logarithmic converter, wherein the logarithmic converter comprises:
  - an input terminal configured to receive the input current;
  - a logarithmic bipolar transistor having a collector connected to the input terminal and an emitter configured to generate a logarithmic output voltage; and
  - an emitter resistance compensation circuit comprising a scaled replica of the logarithmic bipolar transistor, wherein the emitter resistance compensation circuit is configured to receive a scaled copy of the input current and to generate a compensation signal operable to adjust the logarithmic voltage to correct for an error arising from an emitter resistance of the logarithmic bipolar transistor, wherein the emitter resistance compensation circuit comprises a pair of bipolar transistors configured to sense a difference voltage that changes based on the emitter resistance of the logarithmic bipolar transistor times a scaled copy of the input current.

13. The logarithmic current to voltage converter of claim 1, further comprising a resistor connected between an emitter of the bipolar transistor and a ground voltage.

14. The logarithmic current to voltage converter of claim 1, further comprising a field-effect transistor having a gate connected to the collector of the logarithmic bipolar transistor and a source connected to a base of the bipolar transistor.

15. The logarithmic current to voltage converter of claim 1, further comprising an input current source that generates the input current.

16. The photocurrent detection system of claim 12, wherein the logarithmic converter further includes a bipolar transistor having a collector connected to the emitter of the logarithmic bipolar transistor.

17. The photocurrent detection system of claim 12, wherein the compensation signal is proportional to the emitter resistance.

18. The photocurrent detection system of claim 16, wherein the logarithmic converter further includes a resistor connected between an emitter of the bipolar transistor and a ground voltage.

19. The photocurrent detection system of claim 16, wherein the logarithmic converter further includes a field-effect transistor having a gate connected to the collector of the logarithmic bipolar transistor and a source connected to a base of the bipolar transistor.

20. The photocurrent detection system of claim 12, wherein the replica of the logarithmic bipolar transistor is scaled down in size relative to the logarithmic bipolar transistor.

* * * * *